United States Patent [19]

Lee

[11] Patent Number: 5,136,152
[45] Date of Patent: Aug. 4, 1992

[54] HYBRID OPTICAL PICKUP WITH INTEGRATED POWER EMISSION AND READING PHOTODETECTORS

[75] Inventor: Wai-Hon Lee, Cupertino, Calif.

[73] Assignee: Hoetron, Inc., Sunyvale, Calif.

[21] Appl. No.: 630,150

[22] Filed: Dec. 19, 1990

[51] Int. Cl.$^5$ ............................ H01J 40/14; G11B 7/12
[52] U.S. Cl. .................................. 250/211 J; 369/112
[58] Field of Search ............... 250/211 J, 239; 357/19; 369/13, 44.37, 109, 110, 112

[56] References Cited

U.S. PATENT DOCUMENTS

| | | | |
|---|---|---|---|
| 4,731,772 | 3/1988 | Lee | 369/112 |
| 4,757,197 | 7/1988 | Lee | 357/19 |
| 4,789,977 | 12/1988 | Oudenhuysen et al. | 369/109 |
| 4,847,848 | 7/1989 | Inoue et al. | 357/19 |
| 4,894,815 | 1/1990 | Yamanaka et al. | 369/112 |
| 5,062,098 | 10/1991 | Hori et al. | 369/112 |

Primary Examiner—David C. Nelms
Assistant Examiner—John R. Lee
Attorney, Agent, or Firm—Townsend and Townsend

[57] ABSTRACT

A compact hybrid laser and photodetector device is disclosed. A heat sink and a metal layer are bonded together, and then mounted on a circuit board. A semiconductor laser chip is mounted on the metal layer. The edge of the metal layer serves as a bonding pad for a wire connection to a bonding pad on the circuit board. A rear-facet photodetector is mounted on the circuit board beneath the semiconductor laser chip. A multiple element photodetector is also mounted on the circuit board for detecting a signal reflected off a media. Preferably, the rear facet and multiple element photodetectors are a single integrated circuit.

23 Claims, 9 Drawing Sheets

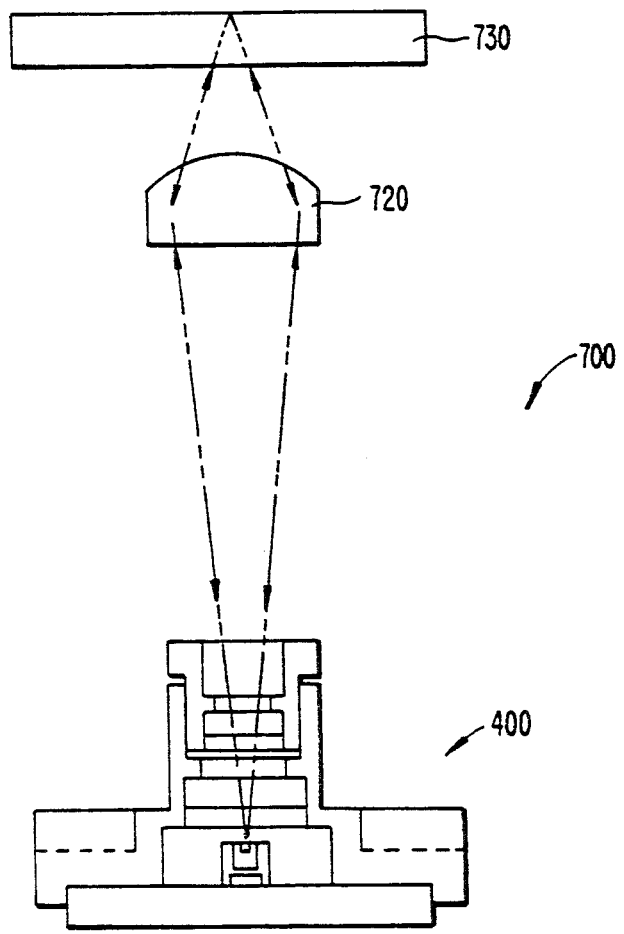
FIG. 7.
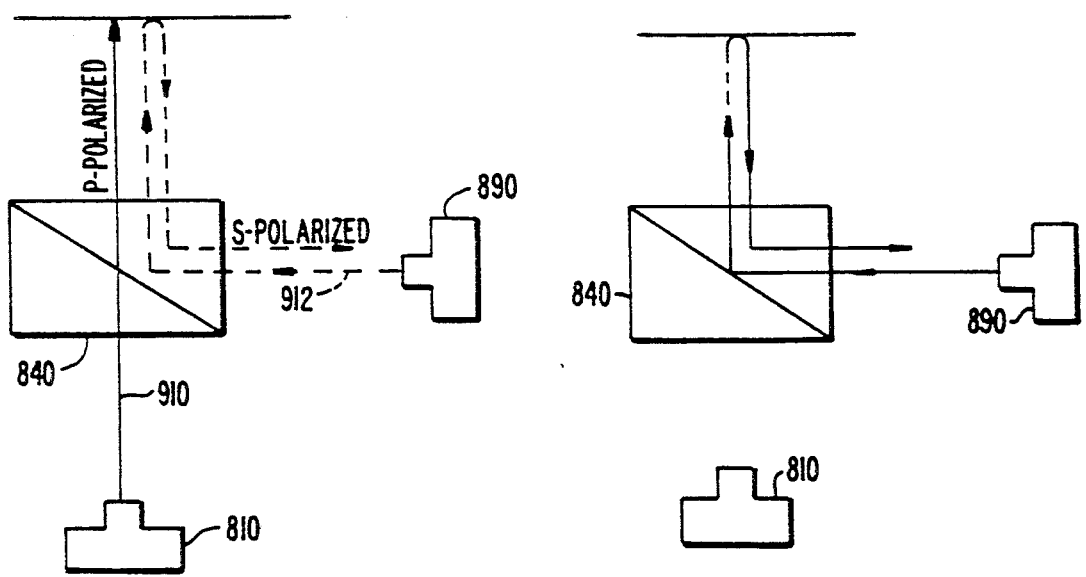
FIG. 9A.
FIG. 9B.

HYBRID OPTICAL PICKUP WITH INTEGRATED POWER EMISSION AND READING PHOTODETECTORS

BACKGROUND

The present invention relates to optical pickups for reading data on optical disks.

U.S. Pat. No. 4,757,197 and U.S. Pat. No. 4,731,772 of this inventor disclosed the construction of a hybrid device and the use of the hybrid device and a hologram lens in an optical pickup.

FIG. 1 shows a hybrid device 100 from U.S. Pat. No. 4,757,197 containing a power monitor photodetector 101 on the back side of a laser diode chip 103. Laser diode chip 103 is mounted on a heatsink 107. A four segment photodetector 105 is mounted on the top of heatsink 107. Electrical connections to the photodetectors and the laser chip are accomplished by wires bonded from the devices to the pins 109–116 of a header structure.

FIG. 2 shows one of the constructions of an optical pickup disclosed in U.S. Pat. No. 4,731,772. The hybrid device 100 of FIG. 1 provides the light source and the detection mechanism for the pickup. A hologram lens 74 fulfills the functions of a beamsplitter and other lenses in a conventional optical pickup. The position of hologram lens 74 can either before or after a collimating lens 72. In another embodiment the collimating lens can be eliminated.

Hybrid device 100, collimating lens 72 and hologram lens 74 form a laser pen 84. A laser beam 70 from device 100 passes through these lenses to a focus and tracking actuator 82. Actuator 82 moves an objective lens 76 with magnetic coils 80 to focus the laser beam on a media 78.

FIG. 3 shows a conventional optical pickup used in a computer storage system. A high power laser diode 300 with output power of 30 mW or more is collimated by a lens 302. The laser diode is arranged so that the polarization of the laser is parallel to the plane of incidence of the beamsplitter (i.e. p-polarized). A polarization beam splitter 304 transmits nearly 100 percent of the collimated laser output through a quarterwave plate 306 to an objective lens 308. The returned beam after reflecting off a disc 310 passes through the quarterwave plate 306 again. As a result, the polarization orientation of the returned beam is rotated 90 degrees from its original polarization direction, and it is reflected by the beamsplitter towards a detector 314. Because the laser diode 300 is used for both reading (low power) and writing (high power), the servo signal at the detector fluctuates widely depending on the power output of the laser diode 300. As a result special electronics are used to normalize the output signals from the photodetectors.

U.S. Pat. No. 4,918,675 of this inventor shows an optical pick-up for a magneto optic medium. P-polarized light is provided from a hybrid laser detector through a beam splitter to the medium and is reflected back to the detector in the hybrid for servo purposes. Where a data value has been written, the reflected light will be partially s-polarized, and will be reflected by the beam splitter to a separate detector. The signal detected is small because only a small component is s-polarized. In addition, the signal is made smaller because originally the beam passes through a hologram lens which is used for servo tracking, thus reducing the intensity of the beam.

SUMMARY OF THE INVENTION

The present invention provides a compact hybrid laser and photodetector device. A heat sink and a metal layer are bonded together, and then mounted on a circuit board. A semiconductor laser chip is mounted on the metal layer. The edge of the metal layer serves as a bonding pad for a wire connection to a bonding pad on the circuit board. A rear-facet photodetector is mounted on the circuit board beneath the semiconductor laser chip. A multiple element photodetector is also mounted on the circuit board for detecting a signal reflected off a media. Preferably, the rear facet and multiple element photodetectors are a single integrated circuit A housing is provided which holds the circuit board at its bottom and has a grating in the middle for splitting a laser beam from the semiconductor laser into three beams, one for data detection and two for servo signals. A cylindrical insert is mounted in the top of the housing holding a hologram lens for diffracting a reflected laser beam to the multiple element photodetector. The housing can be rotated during manufacturing to properly align the hologram lens with the photodetector.

Preferably, the circuit board is two sided, with metal traces connected to the different photodetector elements and the semiconductor laser on the top side. Through-holes connect the traces to contacts on the bottom side of the circuit board, which are in turn connected to a multiple conductor flex cable. A ground plane is also provided on the second side. This compact structure takes up a smaller area than the prior art cylindrical cans with pins.

In one embodiment, the grating for splitting the laser into three beams is not used and instead a surface emitting laser with three emitting points is used as a semiconductor laser. Since the surface emitting laser can be mounted directly to the circuit board, there is no need for an additional heat sink. Without the heat sink in the way, the multiple element photodetectors can be placed on both sides of the laser to intercept both of the diffracted, reflected laser beams. The hologram lens in the housing is mounted at a slight angle, and has a partially reflective bottom surface to reflect some of the laser beam back on to a power emission photodetector located on the circuit board. In addition, in the surface emitting laser structure, the photodetectors are higher on the circuit board than the semiconductor laser, making focus adjustment with the hologram lens on both photodetectors practical.

In one application, the present invention is used in a write once read many (WORM) disk recording system. A first module with only the semiconductor laser is used to provide a powerful writing beam which is p-polarized and passed directly through a beam splitter to the disk. At the same time, an s-polarized beam from a laser and detector module at a right angle to the beam splitter generates a beam which is reflected by the beam splitter onto the disk and is used for producing servo signals for focus and tracking during the writing operation. The s-polarized light reflected off of the disk will be reflected at a right angle by the beam splitter back to the laser and detector module. The P polarized light which is reflected, on the other hand, will be passed straight through the beam splitter, and will not interfere with the detection of the s-polarized servo beam. A beam splitter which will reflect substantially 100% of the s-polarized light and none of the p-polarized light is used. During a read operation, the write laser is not used at all, and the laser and photodetector hybrid module is used for both generating the servo signals and the read signal.

An embodiment for a magneto-optic erasable disk is also provided. Two laser modules and the beam splitter are used, as for the WORM structure. However, the write laser beam is used for both writing and reading. When writing and erasing, more power is applied to the write laser beam and a magnetic field is applied to the optical disk. When reading, a lower power beam is used without a magnetic field applied. The laser and detector module is used for the servo signals only and provides an s-polarized beam for this purpose. The wavelength, however, is different from the wavelength of the read and write laser. During a read operation, the presence of a bit is indicated by the reflected laser beam having an s-polarized component due to interaction with the disk media. This s-polarized component is detected by a multiple element detector in the laser and detector module by being diffracted by a hologram lens to the multiple element detector. Since this laser beam has a different wavelength than the servo laser beam, it will be diffracted at a different angle, to a different detector than the servo laser beam. The separation of the read and servo beams in two modules allows the hologram to be eliminated from the initial read beam path, thereby allowing more of the laser beam to be used and giving a higher intensity signal for the same power.

BRIEF DESCRIPTION OF THE DRAWINGS

FIG. 7 is a diagram showing the use of the module of the present invention for reading data on a medium;

FIG. 9A is a diagram illustrating the use of the system of FIG. 8 for a write operation in a WORM system;

FIG. 9B is a diagram of the laser beam path for a read operation in a WORM system according to FIG. 8;

DETAILED DESCRIPTION OF THE PREFERRED EMBODIMENT

Figure 1:
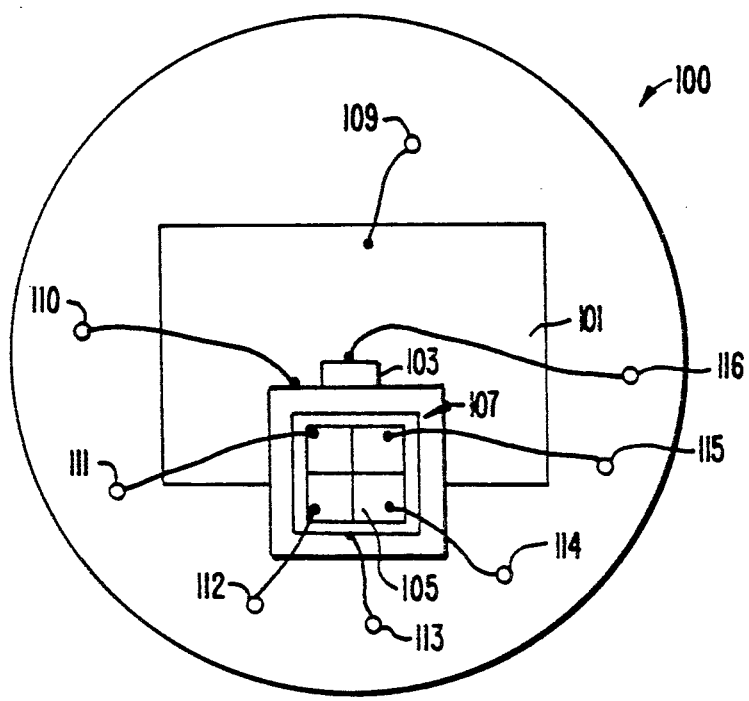
FIG. 1 is a diagram of a prior art laser and detector hybrid device.
Figure 2:
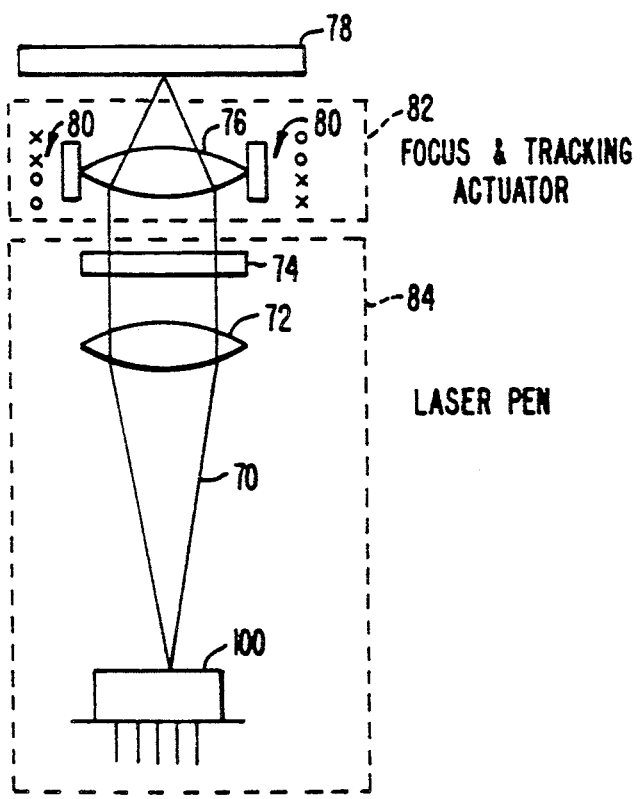
FIG. 2 is a diagram of a prior art optical pickup using the hybrid of FIG. 1 and a hologram lens.
Figure 3:
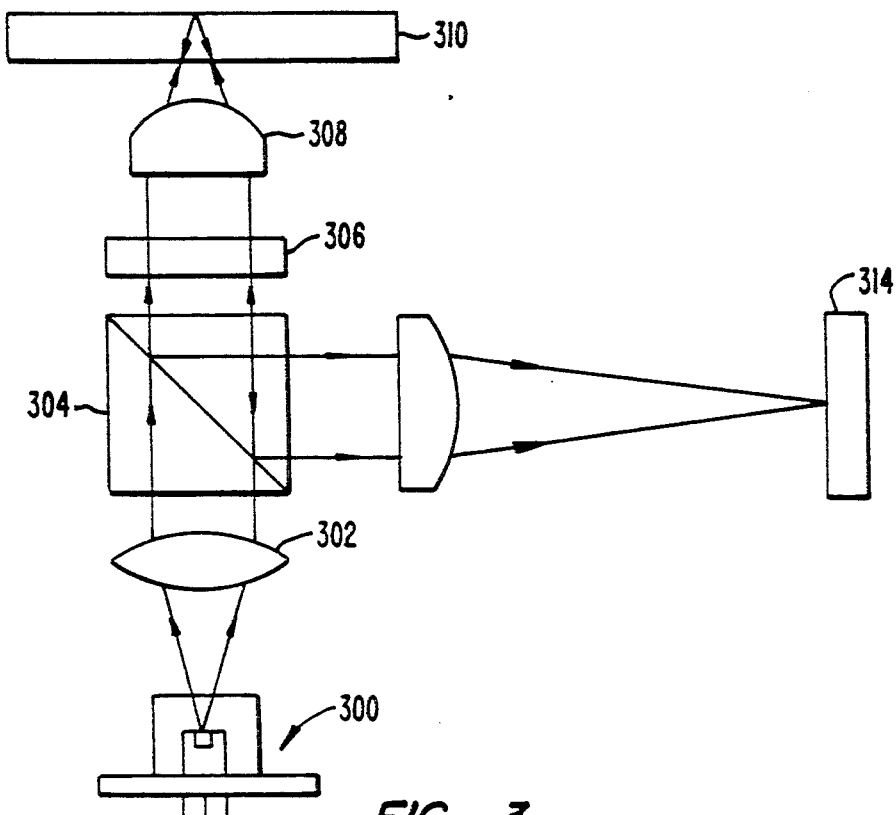
FIG. 3 is a diagram of a prior art conventional write-once read many (WORM) optical pickup.
Figure 4A:
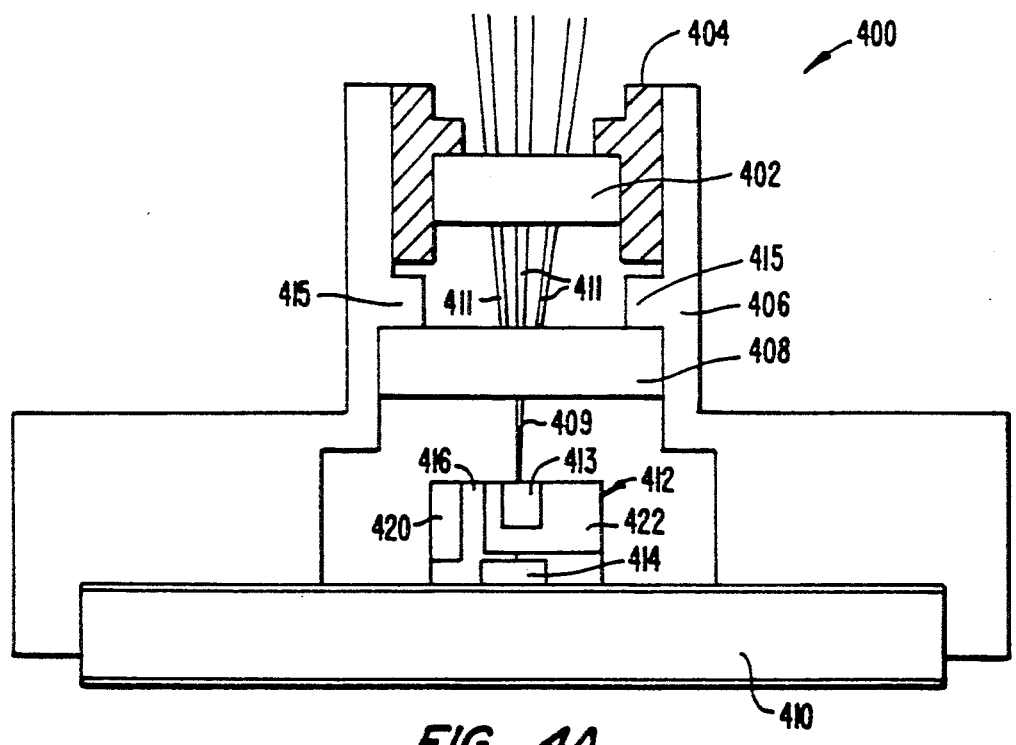
FIG. 4A is a side, cutaway view a housing module of the present invention with the hybrid laser and photodetector, a grating and a hologram lens.

FIG. 4A shows a preferred embodiment of a hybrid module 400. A hologram lens 402 is mounted inside a plastic cylindrical holder 404 which is inserted into a plastic housing 406. A grating 408 is attached to a surface inside the housing under the hologram lens. A circuit board 410, made of heat dissipating yet electrical isolating material, is used to support a laser module 412 and a photodetector 414. The circuit board containing the devices is attached to the other end of the hybrid housing.

Module 412 has a laser diode chip 413 mounted on a metal, layer 422 on a heat sink 416. A second metal layer 420 is also provided. Photodetector 414 is mounted in front of laser module 412 on circuit board 410.

A laser beam 409 emitted by chip 413 is diffracted into three separate beams 411 by diffraction grating 408. After these beams have been reflected off of an optical disk, hologram lens 402 will diffract the reflected beams to direct them to photodetector 414.

The module 400 is built by first inserting grating 408 and epoxying it to housing 406. The grating is inserted from the bottom until it abuts tabs 415 in the housing. Next, the assembled circuit board assembly can be inserted and glued to the bottom of the housing. Hologram lens 402 is then glued into holder 404. Holder 404 is inserted into the top of housing 406. Holder 404 can be rotated within the housing until the hologram lens is appropriately aligned with photodetector 414. At that point, it can be glued in place with the appropriate epoxy.

Figure 4B:
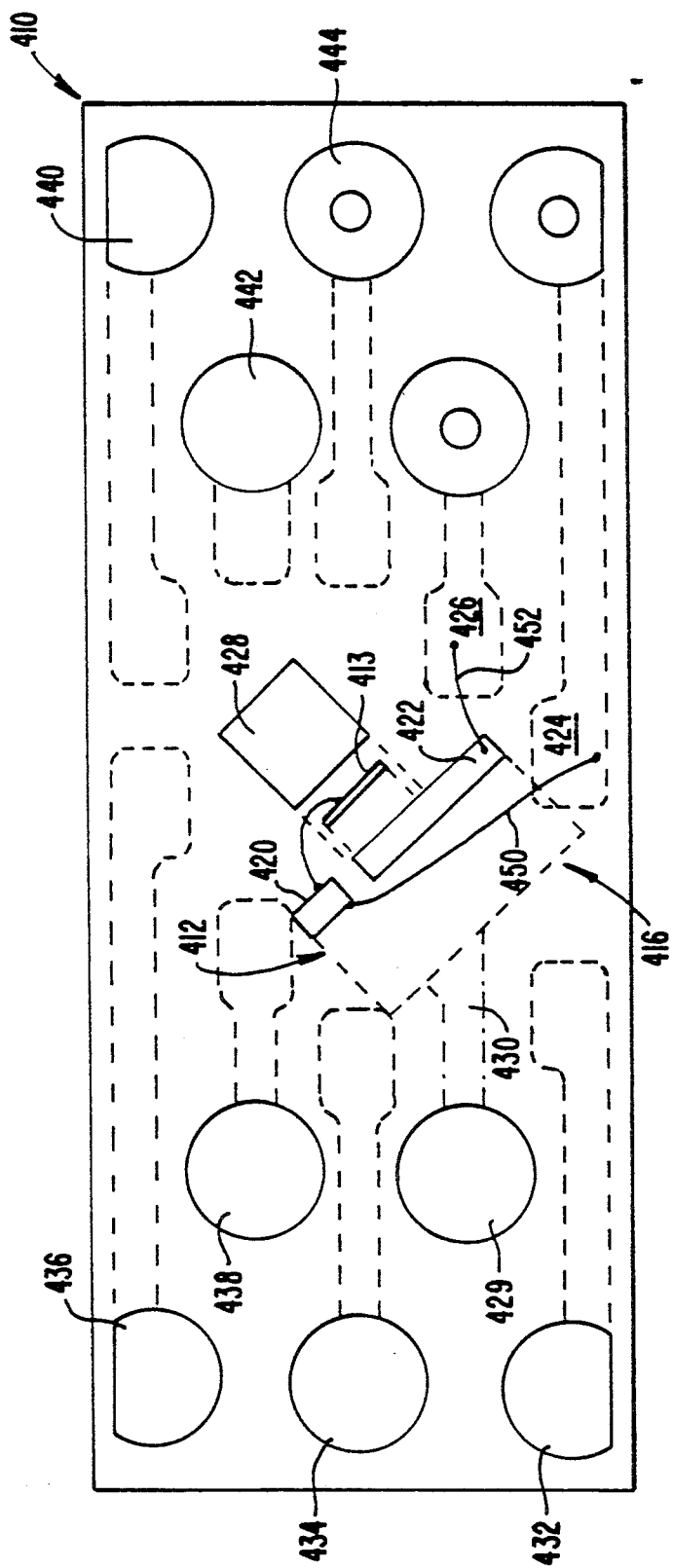
FIG. 4B is a top view of the circuit board containing the laser and detector of FIG. 4A.

FIG. 4B shows the detailed structure on the top side of circuit board 410. Laser module 412 consists of a heatsink 416 and two thin metal layers 420, 422. Laser diode chip 413 is attached to metal layer 422. Heat sink 416 is made of a highly thermal conductive and yet electrically isolating material such as BeO. The two metal strips serve as the bonding pads for the anode and the cathode of the laser diode. The anode of the laser diode is connected to metal layer 420 with a bonding wire 419. Metal layer 420 is in turn connected to a pad 424 by a wire bond 450. The cathode of the laser diode is in contact with metal strip 422, which is connected to pad 426 by bond wire 452.

Figure 4C:
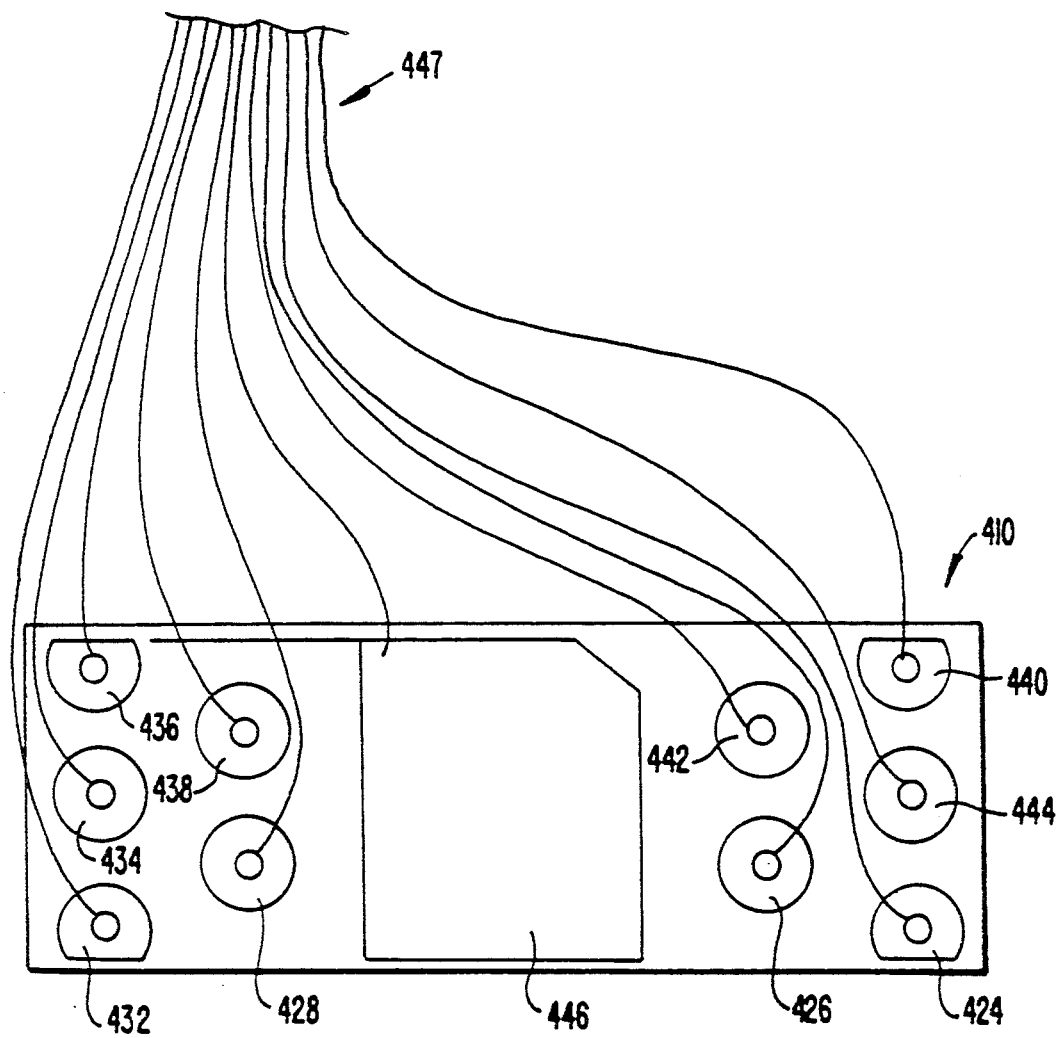
FIG. 4C is a bottom view of the circuit board of FIG. 4B.

A seven segments photodetector 428 is attached to the circuit board with the use of electrically conducting epoxy. The cathode of the photodetector, on its bottom, is connected through the conducting epoxy to a pad which is connected to metal trace 430. Trace 430 is connected to a feed-through hole 429. The anodes of the seven segment detectors are wire bonded to the remaining seven pads which are connected by metal traces to feed-through holes 432-442. With the feed-through holes, which are filled with electrically conductive material, the pads on the one side of the circuit board are connected to the other side of the circuit board, which is shown in FIG. 4C. The laser diode and the photodetectors are connected to remote electronic circuits for generating and analyzing signals. The connection is made by soldering wires from a multiple conductor flex circuit 447 to the pads on the back side of the circuit board. A electrical conductive layer 446 is used to provide a ground plane to filter out the high frequency noise in the outputs of the photodetectors.

Figure 5:
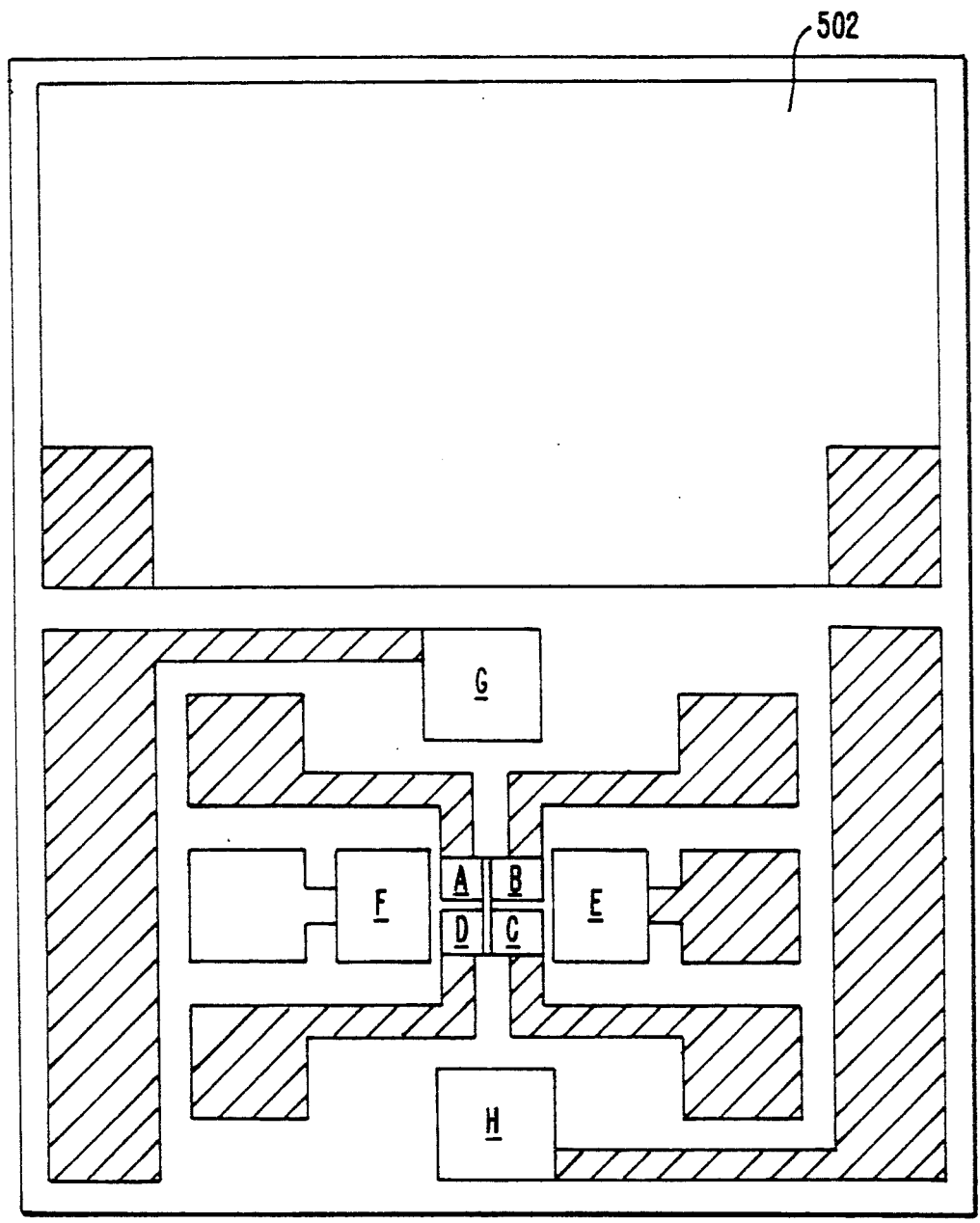
FIG. 5 is a diagram of an integrated multiple component photodetector and rear emission photodetector.

FIG. 5 is a preferred embodiment of an integrated nine segments photodetector. Detector 502 is used to monitor the back emission of the laser diode. Detectors E and F are for the detection of a tracking error signal using a three beam tracking servo method. Detectors A, B, C, and D are used for sensing the focus error signal and the data recorded on the disk. Nine segments are used, rather than the seven discussed for FIG. 4B, because detectors G and H are added for sensing the data signal when the hybrid device is used in a magneto-optics optical disk system.

Figure 6A:
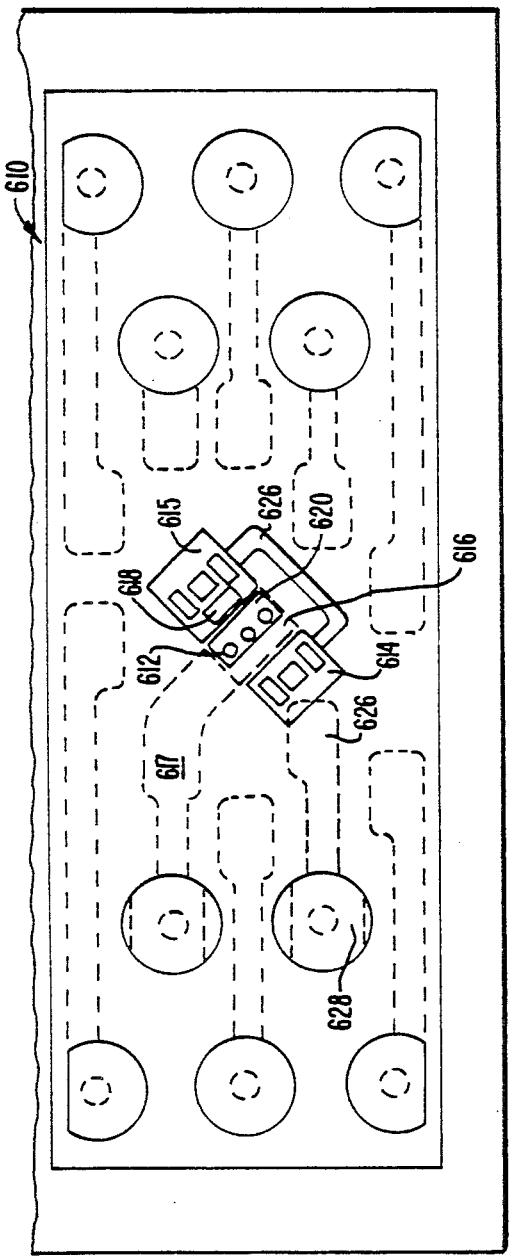
FIG. 6A is a diagram of an alternate embodiment of the circuit board of FIG. 4B using three surface emitting laser diodes.

FIG. 6A shows a second embodiment of a circuit board 610 for the hybrid device. In this embodiment a surface emitting laser diode chip 612 with three emitting points is used along with two multiple element photodetectors 614, 615. The surface emitting laser diode chip is cemented by electrical conductive epoxy to a conductive pad 616 on the circuit board. Pad 615 is connected by a metal trace 617 to a through-hole. Unlike the first embodiment in FIG. 4C, two sets of detectors 614, 615 are symmetrically placed on either side of the lasers. Since the thickness of the laser chip 612 is of the order of 0.1 mm and the thickness of the photodetector chips are about 0.3 mm, a hologram lens can be designed to image the returned beam onto both of the detectors without significant focusing error (see FIG. 6B). Hence the light collection efficiency of this second embodiment is twice that of the first embodiment and results in less required laser output power.

Next to the surface emitting laser diode chip 612 is a photodetector 618 which uses the light reflected from the first surface of the hologram lens to monitor the laser power emitted jointly by the three lasers. In order to use this technique for monitoring the laser power the hologram lens 402 in the hybrid of FIG. 4A is slightly tilted (2.5–4 degrees) and has coating on a first surface to reflect about 10 to 15% of the light incident on the surface back to the detector plane. Since 3 laser diodes are used, grating 408 is eliminated.

The cathodes of the detectors on the photodetector chips are on the bottom of the chips and are connected to the through-hole 628 through metal trace 626. For the sake of simplicity, the wire connections of the anodes of the detector to the pads are not shown.

Power level photodetector 618 and multiple element detector 615 can be integrated on a single semiconductor chip. The anodes of the corresponding elements in photodetectors 614 and 615 are connected in parallel to the same bonding pads. The use of two multiple element detectors thus enables a doubling of the amount of light detected and the signal size. This is possible because the surface emitting laser is mounted directly on the surface board without the need for the heat sink of FIG. 4A.

Figure 6B:
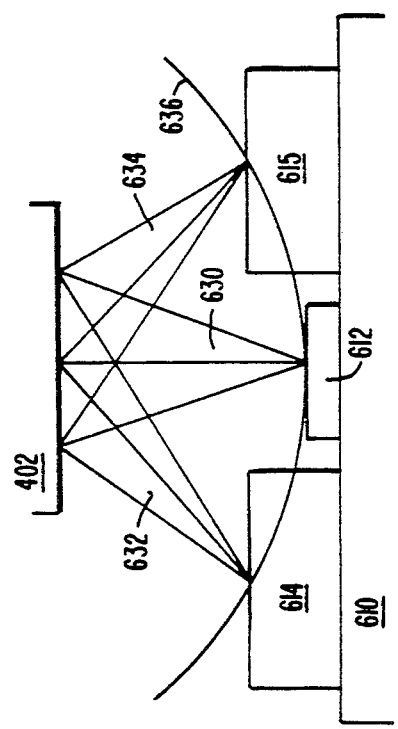
FIG. 6B is a side view of the laser and detector of FIG. 6A illustrating the focusing by the hologram lens.

FIG. 6B shows surface emitting laser 612 along with the to detector chips 614 and 615 mounted on circuit board 610. Hologram lens 402 diffracts the reflected laser beam to produce a zero order beam 630 and two first order beams 632 and 634. Hologram lens 402 is constructed to focus the beams at a focus radii corresponding to a circle 636. As can be seen, with all three beams focused at the same radius, the photodetector chip 614 and 615 must be higher off the circuit board 610 so that the photodetectors will be at the focus point. The circle shown corresponds to the distance between laser 612, which emits the beam in the first place, and hologram lens 402. The focus point of the return beam can be easily adjusted at the radius of the circle (the distance between laser diode 612 and the hologram lens) and for shorter radii, but adjustment will be difficult for longer radii. Accordingly, having the photodetector chips higher off the circuit board makes this adjustment possible. The design of this invention allows a surface emitting laser with power as low as 0.6 milliwatts to work. This is about the power level of presently available surface emitting lasers.

FIG. 7 shows how the hybrid device 400 of the present invention is used in an optical pickup 700. The hybrid device 400 is mounted below an objective lens 720 which is designed to image the laser emitting point to the disc surface 730. The lens 720 is called a finite conjugate objective lens, in contrast to an infinite conjugate lens which requires a collimating lens located in between the hybrid and the objective lens. The hybrid device 400 is slightly rotated so that the three beams emitted from the hybrid device are aligned with the data track on the disk. With the hybrid device of the present invention, the construction of an optical pickup is reduced to the simplest form.

Figure 8:
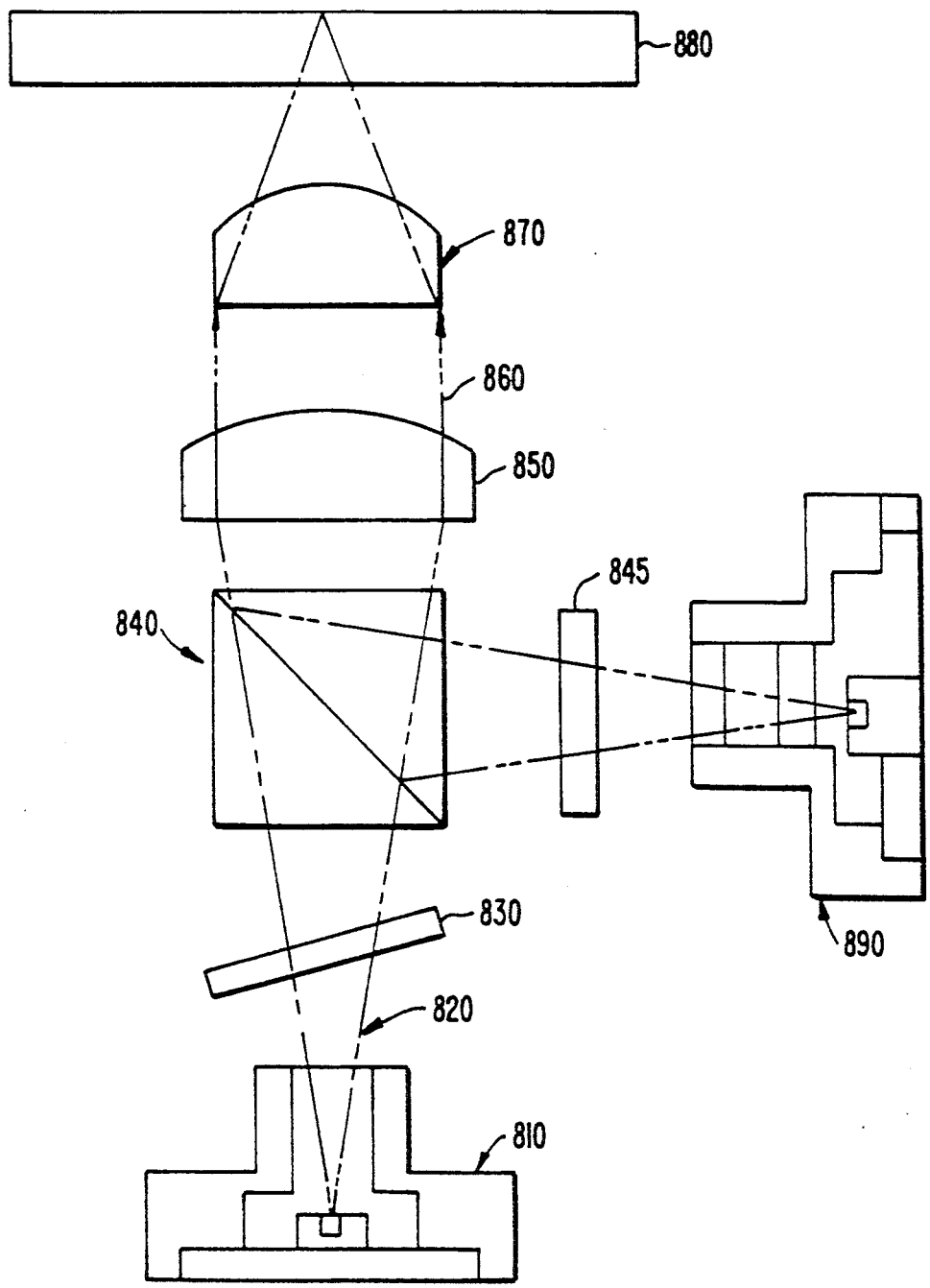
FIG. 8 is a diagram of a two module optical head for use in WORM or erasable magneto-optic applications.

FIG. 8 shows an optical pickup of the present invention for an optical data recording system which can be either a write-once read many (WORM) optical disk system or an erasable optical disk system. A high power laser diode 810 emits a laser beam with polarization parallel to the plane of incidence (p-polarized), which is transmitted nearly 100% by polarization beamsplitter 840 towards a collimating lens 850. A glass 830 with a tilt angle (5–10 degrees) is used to correct the astigmatism in the emitted laser beam (if a surface emitting laser is used there is no astigmatism and thus no need for glass 830). The collimated beam 860 is then focused by objective lens 870 onto the disk surface 880.

A hybrid device 890 with the laser diode oriented to produce a beam in the s polarization direction (perpendicular to plane of incidence) has its beam reflected by the polarization beamsplitter towards collimating lens 850 and objective lens 870. The polarization beamsplitter is used to combine the two beams from two laser sources into collinear beams. The light beam emitted by the hybrid device 890 is used to generate the tracking and focus servo error signals and (for a WORM system) to read the data recorded on the disk surface. The high power laser is for writing information on the disc. There are many advantages of this optical head. Since the hybrid device is prealigned for sensing the focal and tracking errors, the alignment of the optical head is done simply to make the two beams collinear. Secondly, because the polarizations of the two lasers are orthogonal to each other, with the polarization beamsplitter and an optional analyzer 895, the high power beam reflected by the disk during the writing process is blocked from the detector in the hybrid 890. As a result, the focus and tracking servo error signals are not disturbed by the high power write laser beam as in the conventional optical pickup. Analyzer 895 will block out any p-polarized light reflected by beamsplitter 840.

Instead of beamsplitter 840, a plate mounted at an angle could be used. This is cheaper, but will introduce additional astigmatism. This additional astigmatism can be pre-corrected with tilted glass 830. For module 890, the astigmatism of its emitted beam could be corrected using the tilt of the hologram lens.

FIG. 9A illustrates the use of the device of FIG. 8 in a WORM (write-once-read-many) system. In such a system, the information is stored in the form of holes ablated onto the surface of the disk. The holes are formed by using a high power laser beam. The signal is later retrieved by a lower power read laser beam which is modulated by the presence or the absence of holes on the recorded material. For instance, the recorded surface could be reflective, with the hole extending through to a non-reflective portion beneath, thus substantially reducing the reflective signal for a hole.

As shown in FIG. 9A, high powered laser 810 generates a high powered writing laser beam 910 which is p-polarized. This beam passes through beamsplitter 840 to burn a hole onto the disk surface. An s-polarized low power laser beam 912 is generated by module 890 for detecting servo errors and is reflected onto the disk surface by beam splitter 840. Both the p-polarized and s-polarized beams are reflected back to beam splitter 840, but only the s-polarized one is reflected off to the right back to module 890 for detection. The reflected signal is used for servo control for focusing and tracking. As can be seen, this system prevents interference with the photodetectors by the high power p-polarized laser beam 910.

After the data has been written, it can be read using only module 890 as shown in FIG. 9B. Write laser 810 is not used at all for reading. Instead, both reading and servo beams are generated by module 890 and reflected by beam splitter 840 onto the medium surface. The beams reflected back are again reflected by beam splitter 840 to the photodetectors in module 890. The read beam may also be present during a write operation, but is ignored.

In a magneto-optical disk system information is stored by the orientation of the magnetic particles on the disk surface. When a polarized beam of light such as those emitted from a laser source is focused on the magnetic particles, the polarization of the beam reflected from the surface will have its polarization angle slightly rotated from the polarization angle of the incident beam. This effect is called the Kerr effect. Therefore, the laser beam reflected from the disk is constant in intensity but the polarization angle is modulated by the information recorded on the disk.

Figure 10:
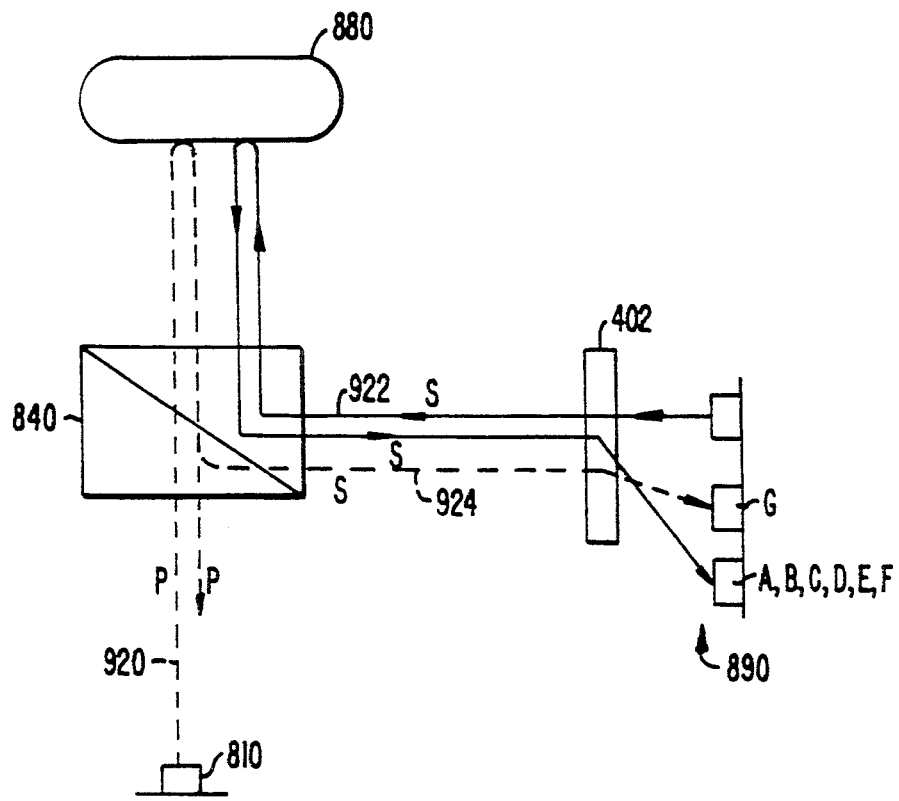
FIG. 10 is a diagram of the laser beam paths for an erasable magneto-optic system using the structure of FIG. 8.

FIG. 10 illustrates the paths of the wavelengths for the device of FIG. 8 used for an erasable magneto optic system. As in the system of FIG. 9A, during writing a p-polarized beam 920 is passed through beam splitter 840 in both directions. By using a higher power applied to laser module 810, in combination with a magnetic field applied behind disk 880, the orientation of the magnetic particles on the disk surface is modified. During this writing, an s-polarized laser beam 922 from laser detector module 890 is used for servo control as in the system of FIG. 9A.

During reading, a lower power beam for module 810 is used, which is different from the system of FIG. 9B. This lower powered beam is also p-polarized and is transmitted through beam splitter 840 to disk 880. If a digital bit has been written on the disk surface, a portion of the beam will be reflected with an S-polarization. This s-polarized component will be deflected by beam splitter 840 as a beam 924 to module 890. By using different wavelengths for laser beams 922 and 924, they will be diffracted by different amounts by hologram lens 402 so that different photodetectors can be used for the two beams.

For instance, if laser module 810 emits a shorter wavelength beam at 780 NM wavelength, it will be diffracted less to a detector G in module 890. If a longer wavelength such as 860 NM wavelength is generated for beam 922, it will be diffracted a greater amount to photodetectors A, B, C, D, E and F in module 890.

Since only a small portion of beam 920 is converted into S-polarization by disk 880, it is important to have a fairly high intensity for beam 920. When a hologram lens is used in a hybrid device, the outgoing beam is diffracted as well, reducing its intensity. By separating the write and read beams into a separate module 810, this outgoing diffraction is avoided since the hologram lens is only used in module 890, which does the detection.

In order to recover the information, the hybrid device 890 contains an integrated detector as shown in FIG. 5. Two additional detectors G and H are used for the reading of the reflected signal beam 924 in a magneto-optics application. Detector G is used when beam 924 has shorter wavelength than the read-laser beam 922 and detector H is used when beam 924 has a longer wavelength. In the magneto-optic recording system the laser beam 922 from the hybrid device 890 is only used to generate the focus and tracking error signals. Writing and reading of information is performed by laser 810.

As can be seen, the detector of FIG. 5 can be used for any number of system. If it is not a magneto-optic system, detectors G and H are simply not used. In a magneto-optic system, depending upon the wavelength, either detector G or detector H can be used at the designer's option. Accordingly, a single integrated circuit can be used for multiple application, cutting down on costs. Similarly, the module 890 shown in FIGS. 8, 9 and 10 can be used for several different applications.

Figure 11:
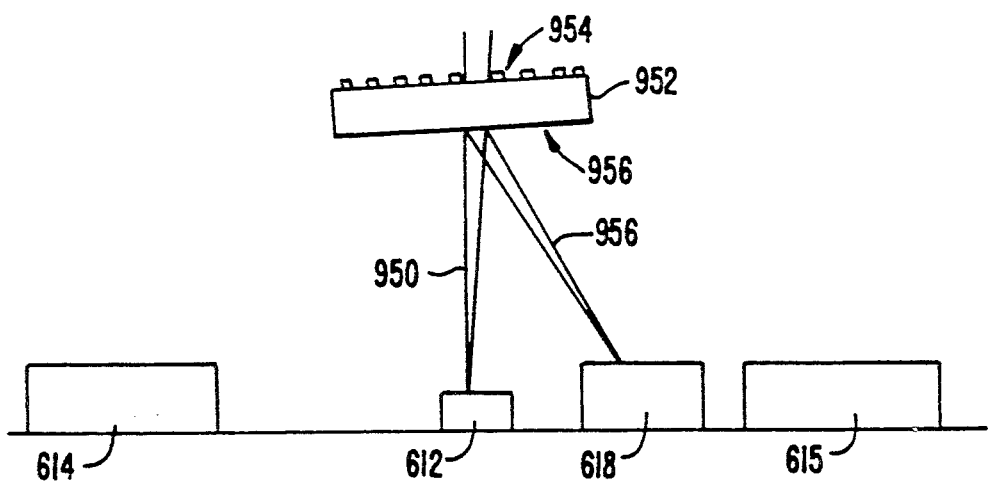
FIG. 11 is a diagram of the power emission detection of a surface emitting laser using a tilted, reflective hologram lens surface.

FIG. 11 illustrates the power emission detection for a surface emitting laser of FIG. 6A. A laser beam 950 is emitted from laser diode 612 and passes through a hologram lens 952. The top surface 954 of hologram lens 952 has the hologram imprinted on it for diffracting the beam when it is reflected back from the disk. The bottom surface 956 is coated with a partially reflective coating. This coating will reflect approximately 10-15% of the laser beam in a reflected beam 958 to power emission power detector 916. Because hologram lens 952 is mounted at a slight angle of 2.5 to 4 degrees, the beam is reflected back to photodetector 618. The angle of inclination is small enough so that the hologram pattern does not need to be altered to compensate for this angle.

As it will be understood by those skilled in the art, the present invention can be embodied in other specific forms without departing from the spirit or essential characteristics thereof. For example, different wavelengths could be used for the embodiment of FIG. 10 or a metal housing can be used instead of plastic housing of FIG. 4A. Alternately, the rear emission photodetector shown in FIG. 4B could be on another side of the laser module at right angles to the multiple element photodetector. Accordingly, the disclosure of the preferred embodiments of the invention is intended to be illustrative, but not limiting, of the scope of the invention which is set forth in the following claims.

What is claimed is:

1. A hybrid laser and photodetector device, comprising:
 a circuit board;
 a rear-facet photodetector mounted on said circuit board;
 a multiple element photodetector mounted on said circuit board;
 a heat sink mounted on said circuit board adjacent said rear-facet photodetector and said multiple element photodetector;

an electrically conducting layer attached to a first side of said heat sink adjacent said rear-facet photodetector; and a semiconductor laser attached to said electrically conducting layer such that a rear emission from said semiconductor laser contacts said rear-facet photodetector.

2. The hybrid device of claim 1 wherein said rear-facet and multiple element photodetectors are contained in a single integrated circuit.

3. The hybrid device of claim 1 further comprising:
a plurality of bonding pads on said circuit board;
a second, isolated electrically conducting layer on said first side of said heat sink;
a first bonding wire connecting an electrode of said semiconductor laser to a first side of said second electrically conducting layer;
a second bonding wire connecting a second side of said second electrically conducting layer, orthogonal to said first side, to one of said bonding pads; and
said first electrically conducting layer making contact with a second electrode of said semiconductor laser and an electrically conducting pad on said circuit board.

4. The hybrid device of claim 1 wherein said electrically conducting layer is metal.

5. The hybrid device of claim 1 further comprising:
a first housing holding said circuit board and having an open, circular top above said semiconductor laser and said photodetectors;
a grating mounted in said housing for splitting a laser beam from said semiconductor laser into three beams;
a second, cylindrical housing mounted in said open, circular top; and
a hologram lens mounted in said second housing, said second housing being rotated within said first housing so that a reflected laser beam is diffracted to said multiple element photodetector.

6. The hybrid device of claim 1 further comprising:
a plurality of metal traces on a first side of said circuit board individually connected to said semiconductor laser, said rear-facet photodetector and said multiple elements of said multiple element photodetector;
a plurality of through-holes with electrical conductors connecting said metal traces to a second side of said circuit board;
a multiple conductor cable having conductors coupled to each of said through-hole electrical conductors; and
a ground plane attached to said second side of said circuit board.

7. A hybrid semiconductor laser and photodetector device comprising:
a housing having an open top for transmitting a laser beam;
a circuit board mounted in a bottom of said housing;
a surface-emitting semiconductor laser mounted on said circuit board;
first and second multiple element photodetectors mounted on opposite sides of said laser on said circuit board;
a power level photodetector mounted on said circuit board adjacent said laser;
a partially reflective lens mounted in said housing above said laser and mounted at an angle with respect to said laser to reflect a portion of a laser beam from said laser to said power level photodetector.

8. The device of claim 7 wherein said surface-emitting laser has three emitting points to produce three laser beams.

9. The device of claim 7 wherein said partially reflective lens has a hologram pattern on one side such that a reflected laser beam is diffracted to impact said first and second multiple element photodetectors.

10. The device of claim 7 wherein said first and second photodetectors extend farther above said circuit board than said laser.

11. A hybrid laser and photodetector device, comprising:
a circuit board;
an integrated rear-facet and multiple element photodetector mounted on said circuit board;
a heat sink mounted on said circuit board adjacent said integrated photodetector;
an electrically conducting layer attached to a first side of said heat sink adjacent said rear-facet photodetector;
a semiconductor laser attached to said electrically conducting layer such that a rear emission from said semiconductor laser contacts said rear-facet photodetector;
a plurality of bonding pads on said circuit board;
a second, isolated electrically conducting layer on said first side of said heat sink;
a first bonding wire connecting an electrode of said semiconductor laser to said second electrically conducting layer;
a second bonding wire connecting said second electrically conducting layer to one of said bonding pads; and
said first electrically conducting layer making contact with a second electrode of said semiconductor laser and an electrically conducting pad on said circuit board.

12. A hybrid laser and photodetector device, comprising:
a circuit board;
a rear-facet photodetector mounted on said circuit board;
a multiple element photodetector mounted on said circuit board on a first side of said rear-facet photodetector;
a heat sink mounted on said circuit board on a second side of said rear-facet photodetector opposite said multiple element photodetector;
an electrically conducting layer attached to a first side of said heat sink adjacent said rear-facet photodetector;
a semiconductor laser attached to said electrically conducting layer such that a rear emission from said semiconductor laser contacts said rear-facet photodetector;
a first housing holding said circuit board and having an open, circular top above said semiconductor laser and said photodetectors;
a grating mounted in said housing for splitting a laser beam from said semiconductor laser into three beams;
a second, cylindrical housing mounted in said open, circular top; and
a hologram lens mounted in said second housing, said second housing being rotated within said first housing so that a reflected laser beam is diffracted to said multiple element photodetector.

13. A hybrid semiconductor laser and photodetector device comprising:
   a housing having an open top for transmitting a laser beam;
   a circuit board mounted in a bottom of said housing;
   a surface-emitting semiconductor laser mounted on said circuit board, said surface-emitting laser having three emitting points to produce three laser beams;
   first and second multiple element photodetectors mounted on opposite sides of said laser on said circuit board;
   a power level photodetector mounted on said circuit board adjacent said laser;
   a partially reflective lens mounted in said housing above said laser and mounted at an angle with respect to said laser to reflect a portion of a laser beam from said laser to said power level photodetector.

14. The device of claim 13 wherein said partially reflective lens has a hologram pattern on one side such that a reflected laser beam is diffracted to impact said first and second multiple element photodetectors.

15. An optical head for writing and reading data on a medium comprising:
   first semiconductor laser means for emitting a writing laser beam having a first polarization;
   beamsplitter means mounted between said first laser means and said medium, for transmitting light of said first polarization and reflecting light of a second polarization to and from said medium in a first direction;
   second semiconductor laser means for emitting a servo laser beam having a second polarization, mounted along said first direction from said beamsplitter;
   photodetector means, mounted adjacent said second semiconductor laser, for producing read and servo signals from at least one reflected laser beam of said second polarization; and
   a diffraction grating lens for diffracting said reflected laser beam to said photodetector means.

16. The optical head of claim 15 wherein said medium is a Write Once Read Many optical medium and wherein a reading laser beam is emitted from said second semiconductor laser means.

17. The optical head of claim 16 wherein said reading laser beam and said servo laser beam are the same laser beam.

18. The optical head of claim 15 wherein said medium is a magneto-optic medium and wherein a reading laser beam is emitted from said first semiconductor laser means.

19. The optical head of claim 15 wherein said photodetector means comprises:
   a first photodetector for receiving a first diffracted beam of a first wavelength for reading data; and
   a second, multiple element photodetector for receiving a second diffracted beam of a second wavelength for producing a servo signal.

20. The optical head of claim 19 wherein said first laser means emits a reading laser beam having said first wavelength and said servo laser beam has said second wavelength.

21. An optical head for writing and reading data on a medium comprising:
   first semiconductor laser means for emitting a writing laser beam having a first polarization;
   beamsplitter means mounted between said first laser means and said medium, for transmitting light of said first polarization and reflecting light of a second polarization to and from said medium in a first direction;
   second semiconductor laser means for emitting a servo laser beam having a second polarization, mounted along said first direction from said beamsplitter, said second semiconductor laser means including
      a circuit board,
      a rear-facet photodetector mounted on said circuit board,
      a multiple element photodetector mounted on said circuit board on a first side of said rear-facet photodetector for producing read and servo signals from at least one reflected laser beam of said second polarization,
      a heat sink mounted on said circuit board on a second side of said rear-facet photodetector opposite said multiple element photodetector,
      an electrically conducting layer attached to a first side of said heat sink adjacent said rear-facet photodetector, and
      a semiconductor laser attached to said electrically conducting layer such that a rear emission from said semiconductor laser contacts said rear-facet photodetector; and
   a diffraction grating lens for diffracting said reflected beam of light to said multiple element photodetector.

22. An optical head for writing and reading data on a medium comprising:
   first semiconductor laser means for emitting a writing laser beam having a first polarization;
   beamsplitter means mounted between said first laser means and said medium, for transmitting light of said first polarization and reflecting light of a second polarization to and from said medium in a first direction; and
   second semiconductor laser means for emitting a servo laser beam having a second polarization, mounted along said first direction from said beamsplitter, said second semiconductor laser means including
      a housing having an open top for transmitting a laser beam,
      a circuit board mounted in a bottom of said housing,
      a surface-emitting semiconductor laser mounted on said circuit board,
      first and second multiple element photodetectors mounted on opposite sides of said laser on said circuit board for producing read and servo signals from at least one reflected laser beam of said second polarization,
      a power level photodetector mounted on said circuit board adjacent said laser,
      a partially reflective lens mounted in said housing above said laser and mounted at an angle with respect to said laser to reflect a portion of a laser beam from said laser to said power level photodetector, and
   a diffraction grating lens for diffracting said reflected beam of light to said photodetector means.

23. An optical head for writing and reading data on a medium comprising:

first semiconductor laser means for emitting a reading and writing laser beam having a first polarization and a first wavelength;

beamsplitter means mounted between said first laser means and said medium, for transmitting light of said first polarization and reflecting light of a second polarization to and from said medium in a first direction;

second semiconductor laser means for emitting a servo laser beam having a second polarization and a second wavelength, mounted along said first direction from said beamsplitter;

photodetector means, mounted adjacent said second semiconductor laser, for producing read and servo signals from at least one reflected laser beam of said second polarization, said photodetector means including a first photodetector for receiving a laser beam of said first wavelength for reading data; and a second, multiple element photodetector for receiving a laser beam of said second wavelength for producing a servo signal, and a diffraction grating lens for diffracting reflected laser beams of said first and second wavelengths to said first and second photodetectors, respectively.

* * * * *